(12) United States Patent
Tomonaga et al.

(10) Patent No.: US 11,054,484 B2
(45) Date of Patent: Jul. 6, 2021

(54) ASSEMBLED BATTERY MONITORING SYSTEM

(71) Applicant: DENSO CORPORATION, Kariya (JP)

(72) Inventors: Yukihiro Tomonaga, Kariya (JP); Ryotaro Miura, Kariya (JP)

(73) Assignee: DENSO CORPORATION, Kariya (JP)

(*) Notice: Subject to any disclaimer, the term of this patent is extended or adjusted under 35 U.S.C. 154(b) by 373 days.

(21) Appl. No.: 15/764,694

(22) PCT Filed: Nov. 25, 2016

(86) PCT No.: PCT/JP2016/084869
§ 371 (c)(1),
(2) Date: Mar. 29, 2018

(87) PCT Pub. No.: WO2017/104374
PCT Pub. Date: Jun. 22, 2017

(65) Prior Publication Data
US 2018/0284196 A1 Oct. 4, 2018

(30) Foreign Application Priority Data

Dec. 15, 2015 (JP) .............................. JP2015-244075

(51) Int. Cl.
*G01R 31/36* (2020.01)
*H01M 10/44* (2006.01)
(Continued)

(52) U.S. Cl.
CPC ........ *G01R 31/396* (2019.01); *H01M 10/425* (2013.01); *H01M 10/441* (2013.01);
(Continued)

(58) Field of Classification Search
CPC .... G01R 31/396; H02J 7/0021; H01M 10/482
See application file for complete search history.

(56) References Cited

U.S. PATENT DOCUMENTS 6,255,826 B1 7/2001 Ohsawa et al.
2009/0079396 A1 3/2009 Osamura
(Continued)

FOREIGN PATENT DOCUMENTS

JP 2005-348457 A 12/2005
JP 2014-089112 A 5/2014
(Continued)

*Primary Examiner* — Minh Q Phan
(74) *Attorney, Agent, or Firm* — Posz Law Group, PLC

(57) ABSTRACT

An assembled battery monitoring system includes: a voltage monitoring apparatus; discharging resistance elements and RC filters that are correspondingly coupled between battery cells of an assembled battery and the voltage monitoring apparatus; and discharging switches disposed in the voltage monitoring apparatus correspondingly to the battery cells. The voltage monitoring apparatus has at least three connection terminals for each of the battery cells. Two of the connection terminals are used to monitor a voltage of a corresponding battery cell through an output terminal of a corresponding RC filter, and at least one of a remainder of the connection terminals is used to form a discharging path of the corresponding battery cell when a corresponding discharging switch is turned on. Each discharging resistance element is disposed on the discharging path at a position that prohibits discharging of charges stored in a capacitor of the corresponding RC filter.

15 Claims, 19 Drawing Sheets

(51) Int. Cl.
*H01M 10/48* (2006.01)
*G01R 31/396* (2019.01)
*H02J 7/00* (2006.01)
*H01M 10/42* (2006.01)

(52) U.S. Cl.
CPC ......... *H01M 10/482* (2013.01); *H02J 7/0014* (2013.01); *H02J 7/0021* (2013.01); *H01M 2010/4271* (2013.01); *H02J 7/0063* (2013.01)

(56) References Cited

U.S. PATENT DOCUMENTS

| | | | |
|---|---|---|---|
| 2012/0025835 A1* | 2/2012 | Chandler | B60L 58/10 324/433 |
| 2012/0194135 A1 | 8/2012 | Mizoguchi | |
| 2015/0162759 A1 | 6/2015 | Fujii et al. | |

FOREIGN PATENT DOCUMENTS

| | | |
|---|---|---|
| JP | 2014-090536 A | 5/2014 |
| JP | 2014-102127 A | 6/2014 |

* cited by examiner

ASSEMBLED BATTERY MONITORING SYSTEM

CROSS REFERENCE TO RELATED APPLICATIONS

This application is a U.S. national phase of International Application No. PCT/JP2016/084869 filed on Nov. 25, 2016 and is based on Japanese Patent Application No. 2015-244075 filed on Dec. 15, 2015, the contents of which are incorporated herein by reference.

TECHNICAL FIELD

The present disclosure relates to an assembled battery monitoring system that monitors a voltage of each of battery cells of an assembled battery.

BACKGROUND ART

A voltage monitoring apparatus is coupled to an assembled battery for detecting a voltage of each of battery cells and performing an equalizing processing for equalizing voltages of the battery cells. An RC filter for removing noise is disposed between the assembled battery and the voltage monitoring apparatus. There are various types of RC filters coupled in various ways. One of the RC filters is a so-called independent-type filter. The independent-type filter has a resistance element for discharging, separately from a resistance element constituting the RC filter, and both ends of a capacitor constituting the RC filter are not directly coupled to ends of capacitors of RC filters for adjacent battery cells.

Such an independent-type filter has less variations in cutoff frequency for each of battery cells, and has a noise reduction performance higher than that of a non-independent-type filter disclosed in Patent Literature 1, for example. Further, the independent-type filter has a high resistance to vibrations due to differential oscillation, as compared with an earthed-type filter in which an opposite end of a filter capacitor is grounded as disclosed in Patent Literature 2.

PRIOR ART LITERATURE

Patent Literature

Patent Literature 1: JP 2014-90536 A
Patent Literature 2: JP 2014-64404 A

SUMMARY OF INVENTION

In a conventional assembled battery monitoring system utilizing an independent-type filter, however, charges of filter capacitors are discharged when battery cells are discharged in an equalizing processing. Therefore, it is difficult to shift to a next processing, such as voltage detection, until the filter capacitor is charged again. As a result, a time for processing is elongated in total. Also, it is necessary to rearrange a time schedule for each processing, when a time constant of the RC filter is changed.

It is an object of the present disclosure to provide an assembled battery monitoring system capable of quickly executing a discharging processing of battery cells even in a structure having independent-type filters.

According to an aspect of the present disclosure, an assembled battery monitoring system includes: a voltage monitoring apparatus that is configured to monitor a voltage of each of a plurality of battery cells coupled in series and in multiple stages and forming an assembled battery; a plurality of discharging resistance elements and a plurality of RC filters that are correspondingly coupled between the battery cells and the voltage monitoring apparatus; and a plurality of discharging switches that are disposed in the voltage monitoring apparatus correspondingly for the battery cells and configured to discharge the respective battery cells. The voltage monitoring apparatus has at least three connection terminals for each of the battery cells. Two of the at least three connection terminals are configured to be used to monitor the voltage of a corresponding battery cell through an output terminal of the RC filter, and at least one of a remainder of the at least three connection terminals is configured to be used to form a discharging path of the corresponding battery cell when a corresponding discharging switch is turned on. Each of the discharging resistance elements is disposed on the discharging path at a position that prohibits discharging of charges stored in a capacitor of the corresponding RC filter.

According to a second aspect of the present disclosure, in the assembled battery monitoring system of the first aspect, an input terminal of the RC filter is coupled to a positive end of the corresponding battery cell, and a low-potential terminal of the capacitor is coupled to a negative end of the corresponding battery cell. Further, the discharging resistance element is coupled between at least one of the positive end and the negative end of the corresponding battery cell and a corresponding connection terminal of the voltage monitoring apparatus.

According to a third aspect of the present disclosure, in the assembled battery monitoring system of the first aspect, an input terminal of the RC filter is coupled to the negative end of the corresponding battery cell, and a high-potential terminal of the capacitor is coupled to the positive end of the corresponding battery cell. Further, the discharging resistance element is coupled between at least one of the positive end and the negative end of the corresponding battery cell and a corresponding connection terminal of the voltage monitoring apparatus, similarly to the second aspect.

In such configurations, when the discharging switch is turned on, the discharging path is formed in parallel with the battery cell as well as the RC filter. Therefore, the charges stored in the capacitor are not discharged. Accordingly, the time required for the discharging processing of the battery cells is shortened, and the voltage monitoring apparatus can quickly shift to a next processing.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

First Embodiment

Figure 1:
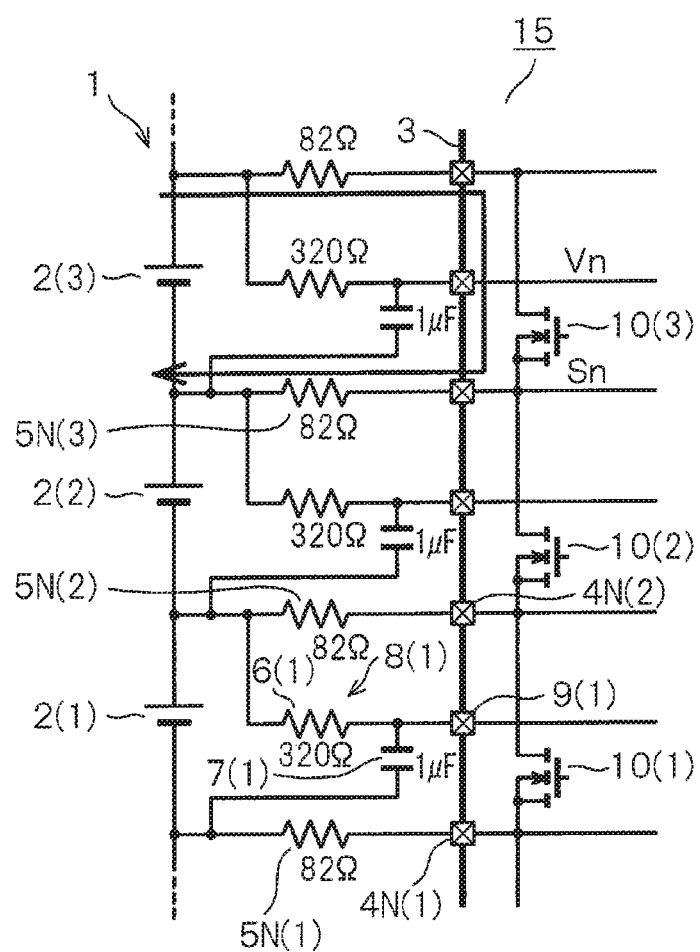
FIG. 1 is a circuit diagram illustrating a part of an assembled battery monitoring system according to a first embodiment of the present disclosure.

Hereinafter, a first embodiment will be described. As shown in FIG. 1, an assembled battery 1 includes a plurality of battery cells 2 (1, 2, 3, . . . ) which are secondary cells and are coupled in series in multiple stages. In the following descriptions of the embodiments and in the drawings, when a battery cell 2 on a specific stage is referred to, the number of the stage is indicated in a rounded bracket after the reference number "2" of the battery cell. For example, the battery cell 2 on the first stage is indicated as "battery cell 2(1)". This indication is similar to other components, and the number of the corresponding stage is indicated in a rounded bracket after the reference number of the component. For example, a discharging switch 10(1) denotes a discharging switch 10 that is provided to correspond to the battery cell 2(1) on the first stage.

A voltage monitoring IC 3 has connection terminals 4N to correspond to negative terminals of respective battery cells 2. The connection terminals 4N are correspondingly coupled to the negative terminals of the battery cells 2 through discharging resistance elements 5N. The voltage monitoring IC 3 corresponds to a voltage monitoring apparatus.

For example, a positive terminal of the battery cell 2(1) is shared with a negative terminal of the battery cell 2(2) on a higher stage, that is, on a higher voltage side of the battery cell 2(1). Thus, assumed that a connection terminal corresponding to the positive terminal of the battery cell 2 is referred to as the connection terminal 4P, the connection terminal 4P(1) can be a connection terminal 4N(2). Hereinafter, a terminal coupled to a positive end of any battery cell 2 will be also referred to as a terminal 4N(+), and a terminal coupled to a negative end of any battery cell 2 will be also referred to as a terminal 4N(−), irrespective to the stage of the battery cell 2.

A series circuit of a resistance element 6 and a capacitor 7 is coupled to the positive terminal and the negative terminal of each battery cell 2. The series circuit of the resistance element. 6 and the capacitor 7 provides an RC filter 8. In the voltage monitoring IC 3, a filter connection terminal 9 is provided between the connection terminals 4 that correspond to each battery cell 2. An output terminal of the RC filter 8, which is a common connection point between the resistance element 6 and the capacitor 7, is coupled to the filter connection terminal 9. A discharging switch 10 is made of an N-channel MOSFET. The discharging switch 10 is coupled between the connection terminals 4N to correspond to each battery cell 2 inside of the voltage monitoring IC 3. As an example, the discharging resistance element 5N has a resistance value of 82Ω, the resistance element 6 has a resistance value of 320Ω, and the capacitor 7 has a capacitance of approximately 1 µF.

Figure 2:
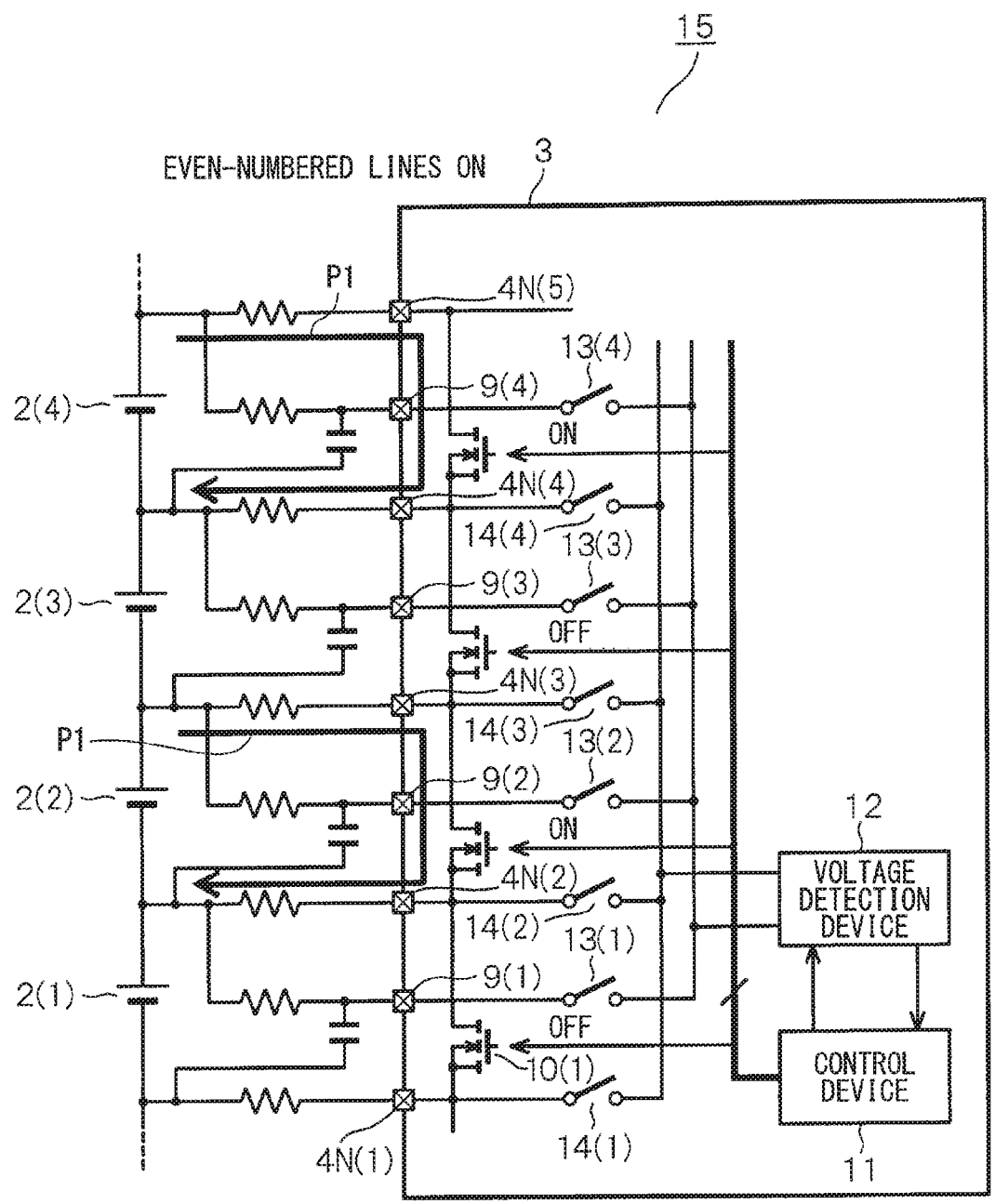
FIG. 2 is a diagram illustrating an entire structure of the assembled battery monitoring system in a state where even-numbered battery cells are discharged.

As shown in FIG. 2, the voltage monitoring IC 3 has a control device 11 and a voltage detection device 12. The filter connection terminal 9 and the connection terminals 4N, which correspond to each battery cell 2, are commonly coupled to respective input terminals of the voltage detection device 12 via a switch 13 and switches 14, respectively. The control device 11 controls on and off of the switches 13 and 14 so that the voltage detection device 12 detects the voltage of each of battery cells 12 independently. The detection results of the voltage detection device 12 are provided to the control device 11. The control device 11 controls on and off of the discharging switches 10 so as to perform an equalizing processing of the respective battery cells 2. An assembled battery monitoring system 15 is configured as described above.

Figure 3:
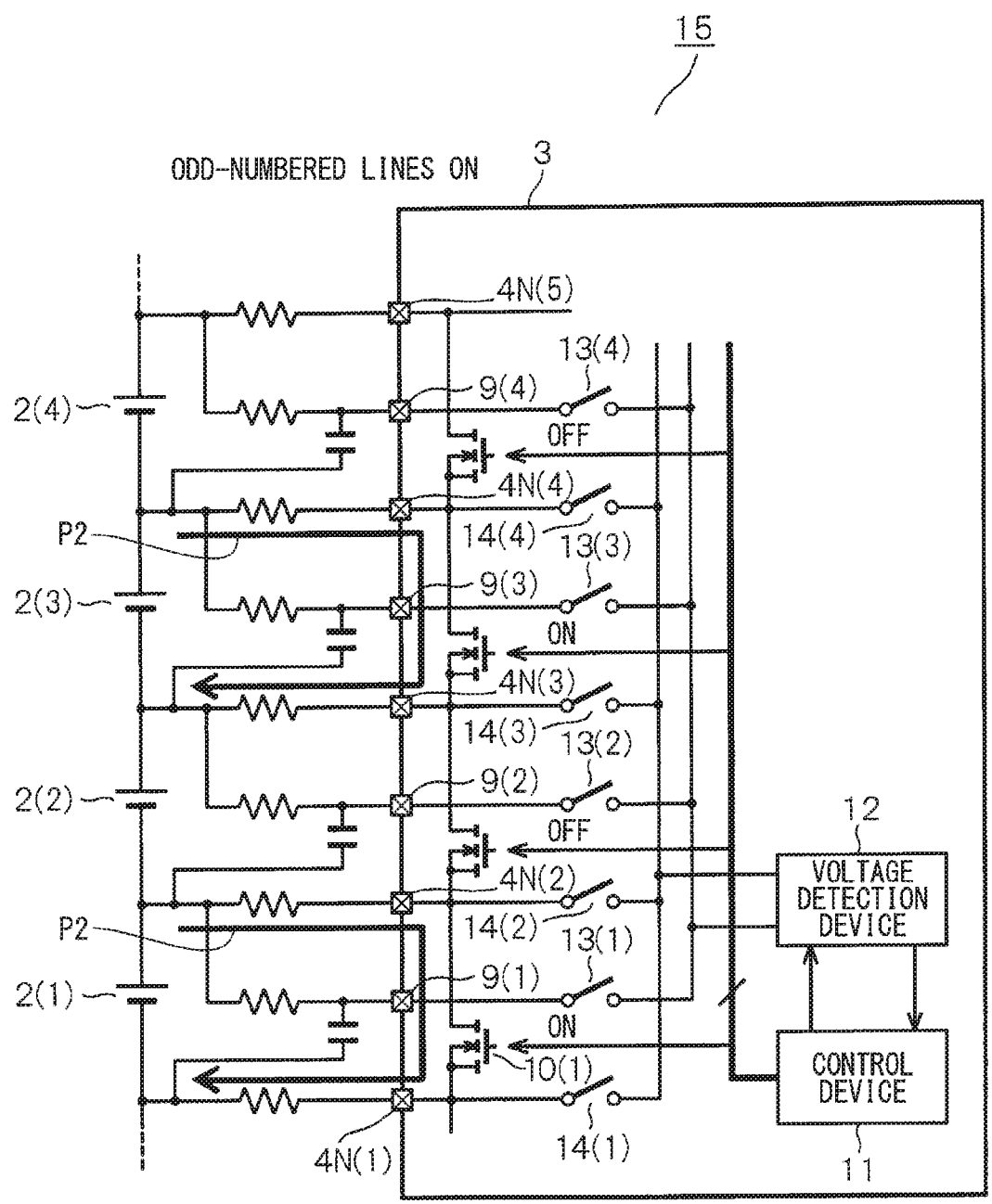
FIG. 3 is a diagram illustrating the entire structure of the assembled battery monitoring system in a state where odd-numbered battery cells are discharged.
Figure 4:
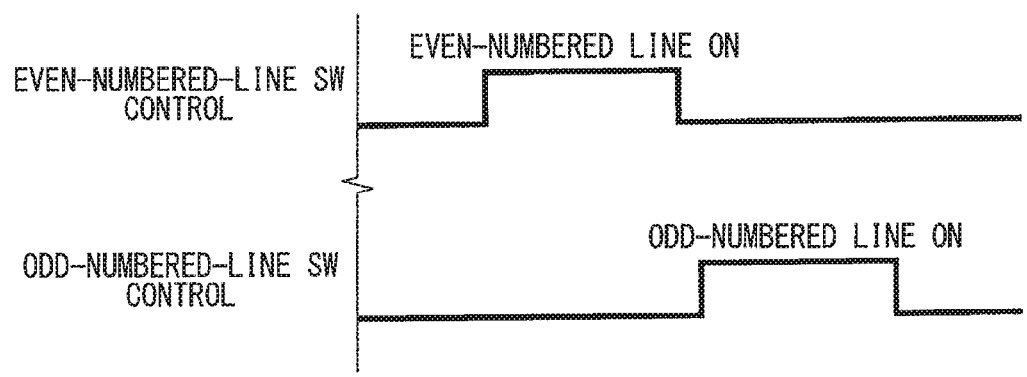
FIG. 4 is a time chart illustrating a control of a case where discharging of each of the even-numbered battery cells and the odd-numbered battery cells is performed collectively.
Figure 5:
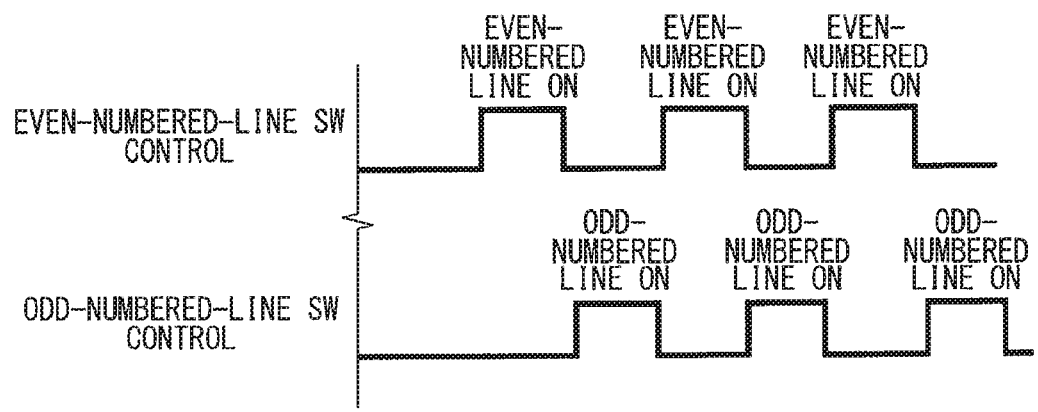
FIG. 5 is a time chart illustrating a control of a case where discharging of each of the even-numbered battery cells and the odd-numbered battery cells performed separately in several times.

In the configuration of the present embodiment, the equalizing processing is performed in a following manner, for example. The switches are controlled in such a manner that discharging of even-numbered battery cells 2(2) and 2(4), which are on even-numbered stages, is performed as shown in FIG. 2, and then discharging of odd-numbered battery cells 2(1) and 2(3), which are on odd-numbered stages, is performed as shown in FIG. 3. In this case, a discharge current is suppressed, and heat generation is preferably suppressed. In such a case, each of the discharging of the even-numbered battery cells 2(2) and 2(4) and the discharging of the odd-numbered battery cells 2(1) and 2(3) may be performed collectively, i.e., simultaneously, as shown in FIG. 4. Alternatively, each of the discharging of the even-numbered battery cells 2(2) and 2(4) and the discharging of the odd-numbered battery cells 2(1) and 2(3) may be performed repetitively, i.e., separately in several times, as shown in FIG. 5. In FIG. 2, arrows P1 show discharging paths caused when the discharging of the battery cells 2(2) and 2(4) are performed by turning on the discharging switches 10(2) and 10(4), which are on even-numbered stages (even-numbered lines). In FIG. 3, arrows P2 show discharging paths caused when the discharging of the battery cells 2(1) and 2(3) are performed by turning on the discharging switches 10(1) and 10(3), which are on odd-numbered stages (odd-numbered lines).

Next, an operation of the present embodiment will be described. When the discharging switch 10 is turned on, the discharging path of the battery cell 2(1) is formed as follows:

Positive terminal of battery cell 2(1)→discharging resistance element 5N(2)→connection terminal 4N(2)→discharging switch 10(1)→connection terminal 4N(1)→discharging resistance element 5N(1)→negative terminal of battery cell 2(1).

Therefore, charges stored in the capacitor 7 of the RC filter 8 are not discharged.

Figure 6:
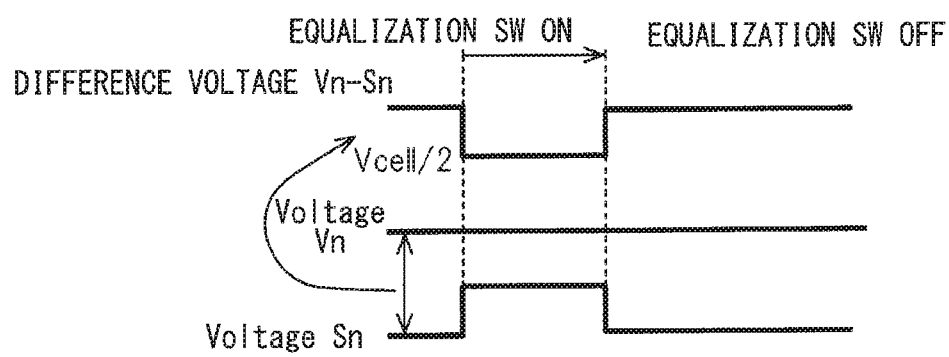
FIG. 6 is a time chart illustrating a change in a differential voltage Vn-Sn in accordance with ON and OFF of a discharging switch.

Assumed that the voltage of the filter connection terminal 9 is defined as Vn, and the voltage of the corresponding connection terminal 4N is defined as Sn. As shown in FIG. 6, when the discharging switch 10 is turned on, a difference voltage Vn−Sn is reduced to a half of terminal voltage $V_{cell}$ of the battery cell 2. When the discharging switch 10 is turned off, the difference voltage Vn−Sn immediately returns to the terminal voltage $V_{cell}$. Therefore, it is possible to quickly shift to the next processing.

Figure 7:
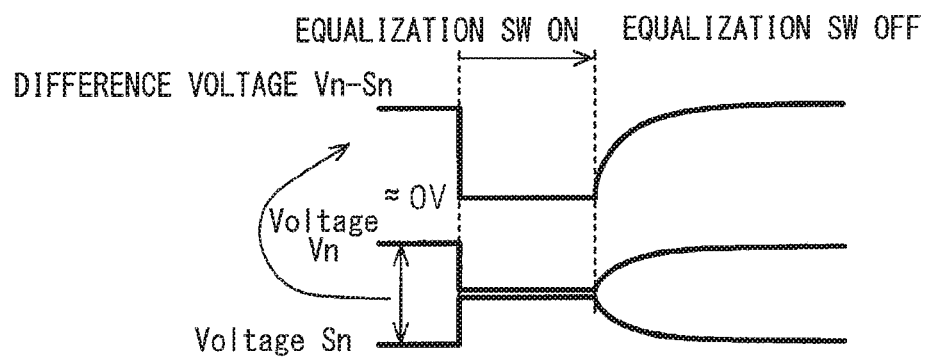
FIG. 7 is a time chart illustrating a change in a differential voltage Vn-Sn in accordance with ON and OFF of a discharging switch in an assembled battery monitoring system having a conventional structure, as a comparative example.
Figure 8:
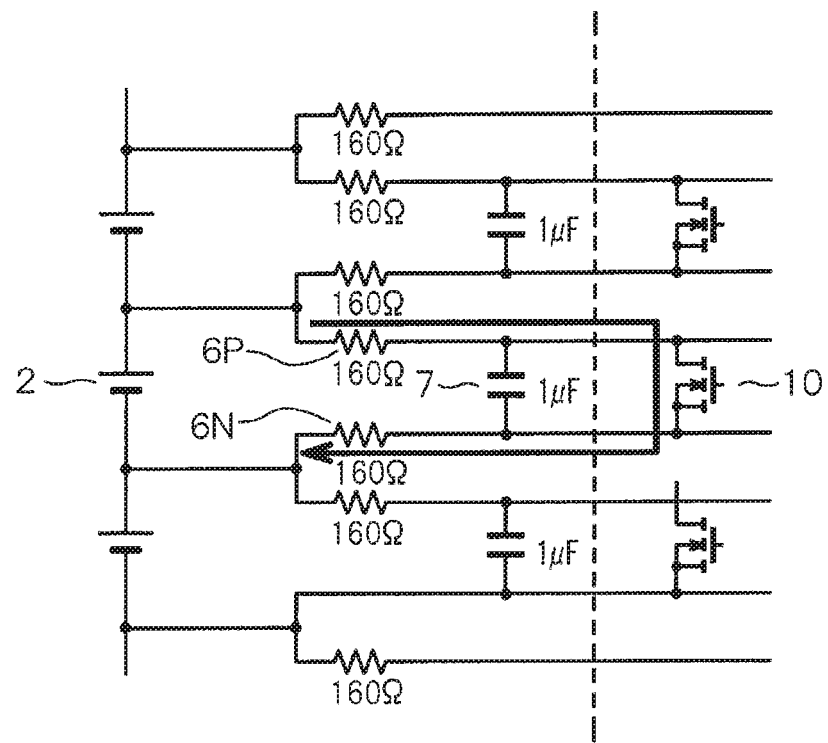
FIG. 8 is a diagram illustrating an example of a conventional structure.

On the other hand, FIG. 8 shows an example of an assembled battery monitoring system of a conventional structure, as a comparative example. In the example of FIG. 8, the resistance element for the filtering is divided into resistance elements 6P and 6N. The resistance element 6P is coupled between the positive terminal of the battery cell 2 and one end of the capacitor 7, and the resistance element 6N is coupled between the negative terminal of the battery cell 2 and the other end of the capacitor 7. The resistance elements 6P and 6N are used also for discharging. In this configuration, when the discharging path of the battery cell 2 is formed, the difference voltage Vn−Sn at the time of turning on the discharging switch 10 is reduced to approximately 0 V, as shown in FIG. 7, because the resistance element 6N is disposed on the discharging path through which the charges stored in the capacitor 7 are discharged. Further, in order to return the difference voltage Vn−Sn to the terminal voltage $V_{cell}$ after the discharging switch 10 is turned off, a time period to complete the charging of the capacitor 7 is necessary. Therefore, it is difficult to quickly shift to the next processing.

In the present embodiment, as described above, the assembled battery monitoring system includes the discharging resistance elements 5, the RC filters 8, and the discharging switches 10. The discharging resistance elements 5 and the RC filters 8 are correspondingly coupled between the battery cells 2 and the voltage monitoring IC 3. The discharging switches 10 are disposed inside of the voltage monitoring IC 3 and correspondingly to the battery cells 2 for discharging the corresponding battery cells 2. The connection terminals 9 and 4N(−) provided in the voltage monitoring IC 3 are used for monitoring the voltages of the battery cells 2 through the output terminals of the RC filters 8. The connection terminals 4N(+) provided in the voltage monitoring IC 3 are used for forming the discharging paths of the battery cells 2 when the discharging switches 10 are turned ON. On each discharging path, the discharging resistance element 5N is arranged at a position that prohibits discharging of the charges stored in the capacitor 7 of the RC filter 8.

Specifically, the input terminal of the RC filter 8 is coupled to the positive end of the corresponding battery cell 2, and the low-potential terminal of the capacitor 7 is coupled to the negative end of the same corresponding battery cell 2. The discharging resistance elements 5N are coupled between the positive end and the negative end of the battery cell 2 and the corresponding connection terminals 4N(+) and 4N(−) of the voltage monitoring IC 3. In this configuration, the discharging paths formed when the discharging switches 10 are turned on are in parallel with the battery cells 2 as well as the RC filters 8. Therefore, the charges stored in the capacitors 7 are not discharged. Accordingly, the time required for the discharging processing of the battery cells 2 can be shortened, and the voltage monitoring IC 3 can quickly shift to a next processing.

Second Embodiment

Figure 9:
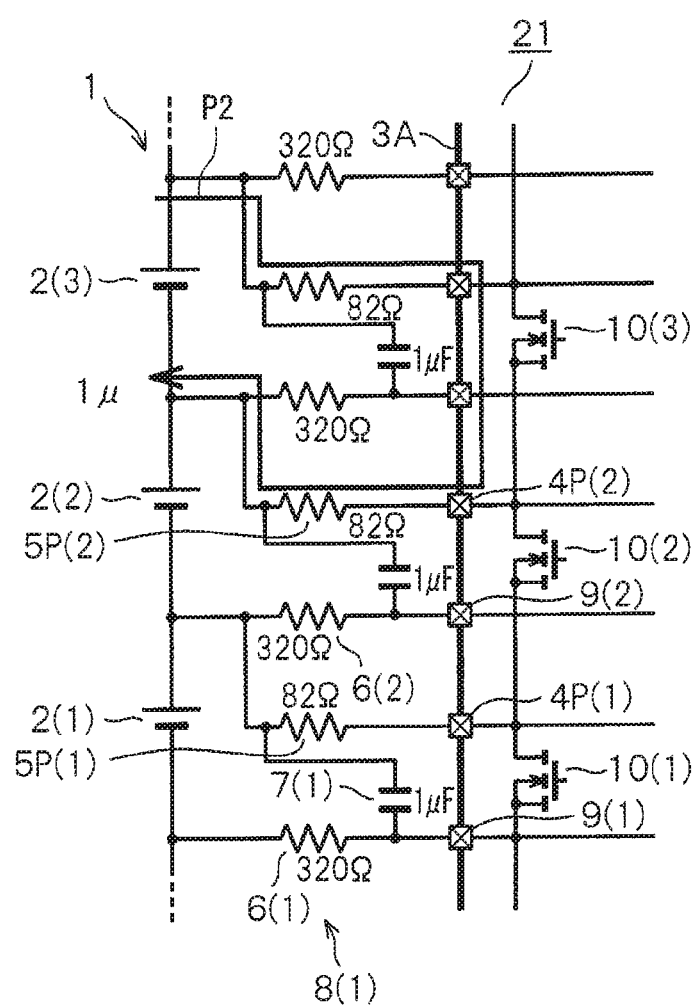
FIG. 9 is a circuit diagram illustrating a part of an assembled battery monitoring system according to a second embodiment of the present disclosure.

Hereinafter, parts same as the first embodiment will be designated with the same reference numbers, and descriptions thereof will be omitted. Parts different from the first embodiment will be described. In an assembled battery monitoring system 21 of the second embodiment, as shown in FIG. 9, a series circuit of the resistance element 6 and the capacitor 7, which provide the RC filter 8, is coupled between a negative terminal and a positive terminal of a corresponding battery cell 2. That is, the series circuit of the resistance element 6 and the capacitor 7 is coupled to the corresponding battery cell 2 in a direction opposite to the first embodiment. An output terminal of the RC filter 8 is coupled to a filter connection terminal 9 that corresponds to the connection terminal 4N of the first embodiment.

A discharging resistance element 5P that corresponds to the discharging resistance element 5N of the first embodiment is coupled between the positive terminal of the corresponding battery cell 2 and a connection terminal 4P that corresponds to the filter connection terminal 9 of the first embodiment. A discharging switch 10 is coupled between the connection terminal 4P corresponding to one corresponding battery cell 2 and the connection terminal 4P corresponding to another one corresponding battery cell 2 on a higher stage, inside of the voltage monitoring IC 3A.

Next, an operation of the second embodiment will be described. When the discharging switch 10(2) is turned on, a discharging path of the battery cell 2(2) is formed as follows:

Positive terminal of battery cell 2(2)→discharging resistance element 5P(2)→connection terminal 4P(2)→discharging switch 10(2)→connection terminal 4P(1)→discharging resistance element 5P(1)→negative terminal of battery cell 2(2).

Also in this configuration, therefore, charges stored in the capacitor 7 of the RC filter 8 are not discharged.

In the second embodiment, as described above, an input terminal of the RC filter 8 is coupled to the negative terminal of the corresponding battery cell 2, and a high-potential terminal of the capacitor 7 is coupled to the positive terminal of the corresponding battery cell 2. Further, the discharging resistance elements 5P are coupled between the positive and negative terminals of the battery cell 2 and the corresponding connection terminals 4P(+) and 4P(−) of the voltage monitoring IC 3. Therefore, effects similar to the first embodiment can be achieved.

Third Embodiment

Figure 10:
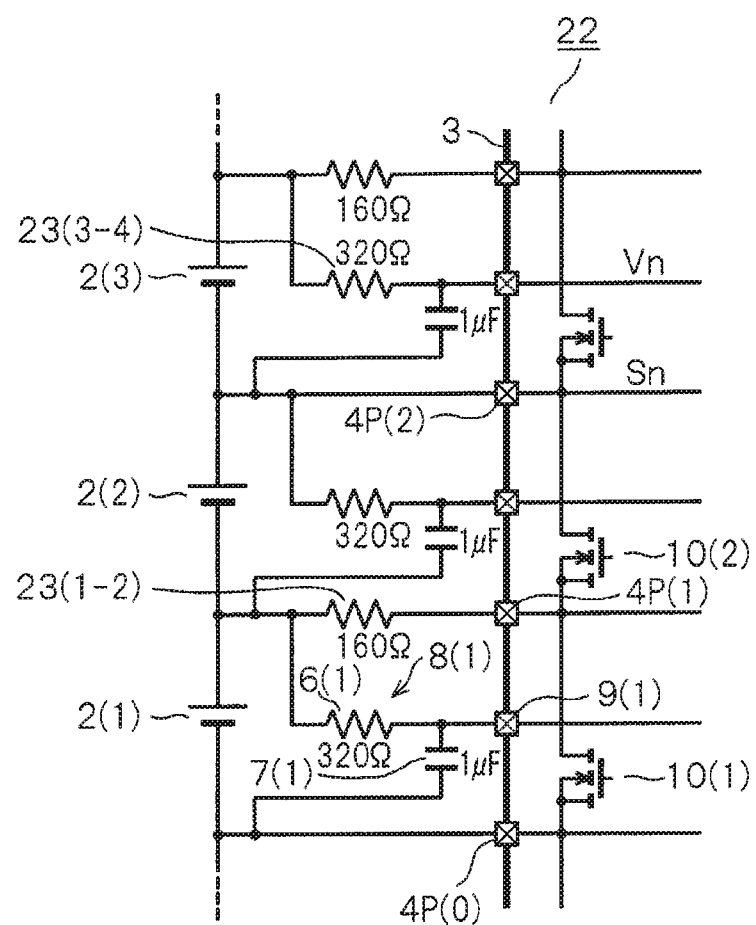
FIG. 10 is a circuit diagram illustrating a part of an assembled battery monitoring system according to a third embodiment of the present disclosure.

As shown in FIG. 10, an assembled battery monitoring system 22 of the third embodiment has a discharging resistance element 23(1-2), at a position of the discharging resistance element 5N(2) of the first embodiment and in place of or as a combination of the discharging resistance elements 5N(1) and 5N(1) of the first embodiment, which form the discharging path of, for example, the battery cell 2(1). In this case, therefore, the discharging resistance element 23 has a resistance value of 160Ω, which is twice of the discharging resistance element 5N. With this arrangement, a connection terminal 4P(1) is provided as a terminal corresponding to the connection terminal 4N(2) of the first embodiment. In this case, the discharging resistance element 23(1-2) is a resistance element shared between the battery cell 2(1) and the battery cell 2(2).

Next, an operation of the third embodiment will be described. When the discharging switch 10(1) is turned on, a discharging path of the battery cell 2(1) is formed as follows:

Positive terminal of battery cell 2(1)→discharging resistance element 23(1-2)→connection terminal 4P(1)→discharging switch 10(1)→connection terminal 4P(0)→negative terminal of battery cell 2(1).

When the discharging switch 10(2) is turned on, a discharging path of the battery cell 2(2) is formed as follows:

Positive terminal of battery cell 2(2)→connection terminal 4P(2)→discharging switch 10(2)→connection terminal 4P(1)→discharging resistance element 23(1-2)→negative terminal of battery cell 2(2).

Fourth Embodiment

Figure 11:
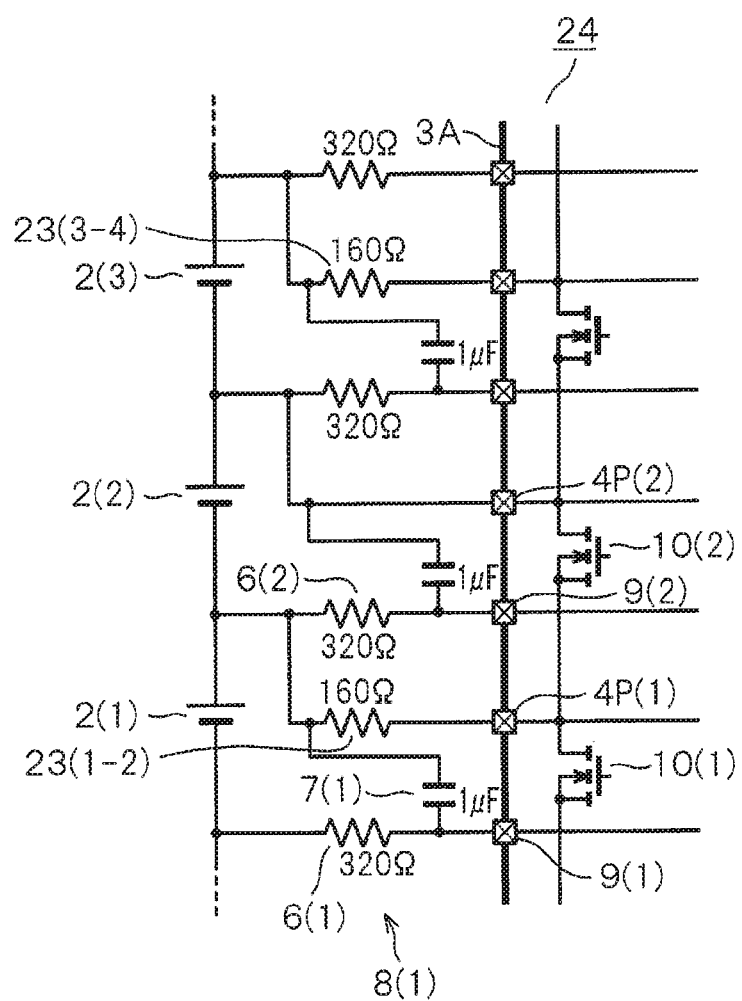
FIG. 11 is a circuit diagram illustrating a part of an assembled battery monitoring system according to a fourth embodiment of the present disclosure.

As shown in FIG. 11, an assembled battery monitoring system 24 of the fourth embodiment has a similar structure to the assembled battery monitoring system 22 of the second embodiment, but has a discharging resistance element 23(1-3) at a position of the discharging resistance element 5P(1) and in place of or as a combination of the two discharging resistance elements 5P(2) and 5P(1), which form the discharging path of, for example, the battery cell 2(1).

Next, an operation of the fourth embodiment will be described. When the discharging switch 10(1) is turned on, a discharging path of the battery cell 2(1) is formed as follows:

Positive terminal of battery cell 2(1)→discharging resistance element 23(1-2)→connection terminal 4P(1)→discharging switch 10(1)→connection terminal 4P(0)→negative terminal of battery cell 2(1).

When the discharging switch 10(2) is turned on, a discharging path of the battery cell 2(2) is formed as follows:

Positive terminal of battery cell 2(2)→connection terminal 4P(2)→discharging switch 10(2)→connection terminal 4P(1)→discharging resistance element 23(1-2)→negative terminal of battery cell 2(2).

Fifth Embodiment

Figure 12:
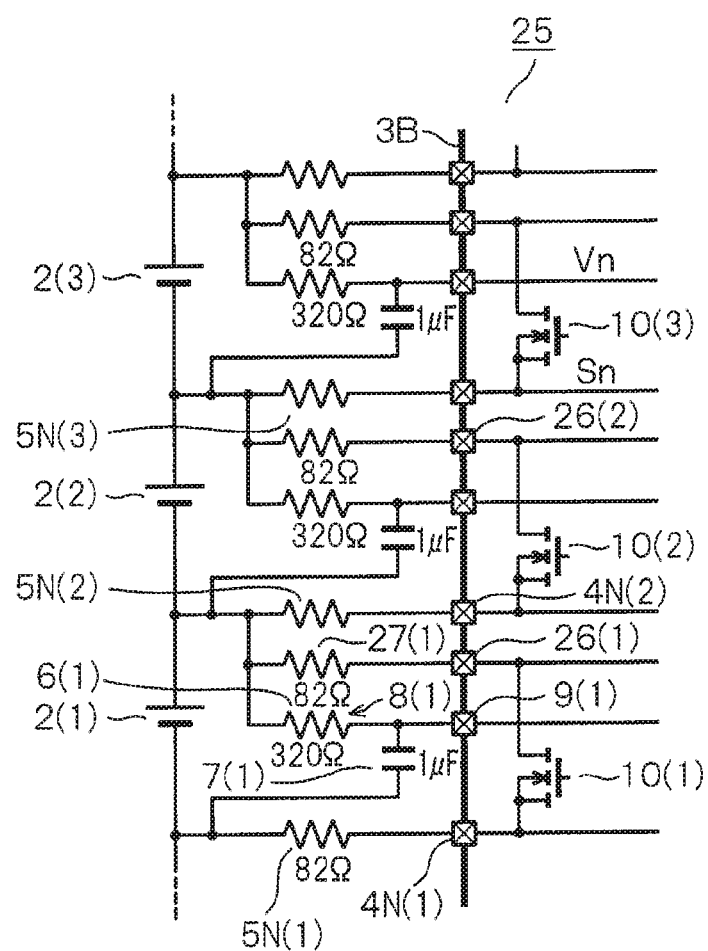
FIG. 12 is a circuit diagram illustrating a part of an assembled battery monitoring system according to a fifth embodiment of the present disclosure.

As shown in FIG. 12, an assembled battery monitoring system 25 of the fifth embodiment has a voltage monitoring IC 3B that has a similar structure to the voltage monitoring IC 3 of the assembled battery monitoring system 15 of the first embodiment and to which discharging terminals 26 are added. Inside of the voltage monitoring IC 3B, each discharging switch 10 is coupled between the discharging terminal 26 and a connection terminal 4N. In addition, a further another discharging resistance element 27 is coupled between a positive terminal of each corresponding battery cell 2 and the corresponding discharging terminal 26. The discharging resistance element 27 has a resistance value of 82Ω.

Next, an operation of the fifth embodiment will be described. When the discharging switch 10(1) is turned on, a discharging path of the battery cell 2(1) is formed as follows:

Positive terminal of battery cell 2(1)→discharging resistance element 27(1)→discharging terminal 26(1)→discharging switch 10(1)→connection terminal 4N(1)→discharging resistance element 5N(1)→negative terminal of battery cell 2(1).

In the fifth embodiment having the configuration as described above, although the number of the terminals of the voltage monitoring IC 3B increases, the discharging path is formed independently for each of the battery cells 2. Therefore, the equalization processing can be performed simultaneously between the adjacent battery cells 2.

Sixth Embodiment

Figure 13:
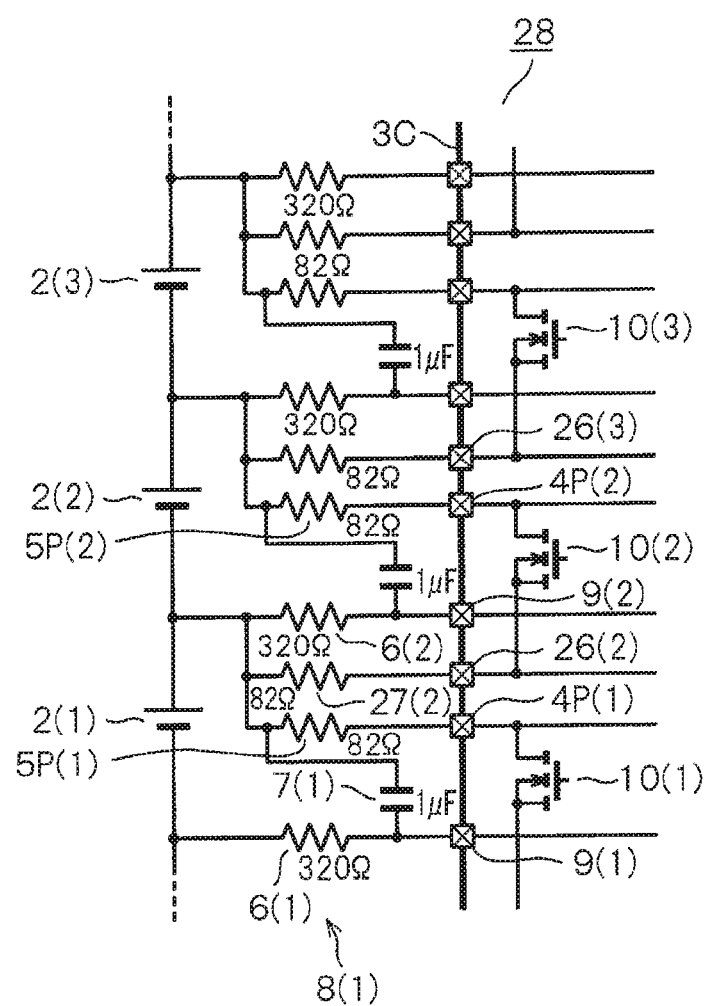
FIG. 13 is a circuit diagram illustrating a part of an assembled battery monitoring system according to a sixth embodiment of the present disclosure.

As shown in FIG. 13, an assembled battery monitoring system 28 of the sixth embodiment has a voltage monitoring IC 3C that is provided by adding to the voltage monitoring system IC 3A of the assembled battery monitoring system 21 of the second embodiment, discharging terminals 26, similarly to the fifth embodiment. Inside of the voltage monitoring IC 3C, the discharging switch 10 is coupled between the connection terminal 4P and the discharging terminal 26. Similarly to the fifth embodiment, the discharging resistance element 27 is coupled between the positive terminal of the corresponding battery cell 2 and the discharging terminal 26. In this case, however, the positive terminal of the battery cell 2(1) is coupled to the discharging terminal 26(2) through the discharging resistance element 27(2).

Next, an operation of the sixth embodiment will be described. When the discharging switch 10(2) is turned on, a discharging path of the battery ell 2(2) is formed as follows:

Positive terminal of battery ell 2(2)→discharging resistance element 5P(2)→connection terminal 4P(2)→discharging switch 10(2)→discharging terminal 26(2)→discharging resistance element 27(2)→negative terminal of battery cell 2(2)

In the sixth embodiment having the configuration as described above, although the number of the terminals of the voltage monitoring IC 3C increases, similarly to the fifth embodiment, the discharging path is formed independently for each of the battery cells 2. Therefore, the equalization processing can be performed simultaneously between the adjacent battery cells 2.

Seventh Embodiment

Figure 14:
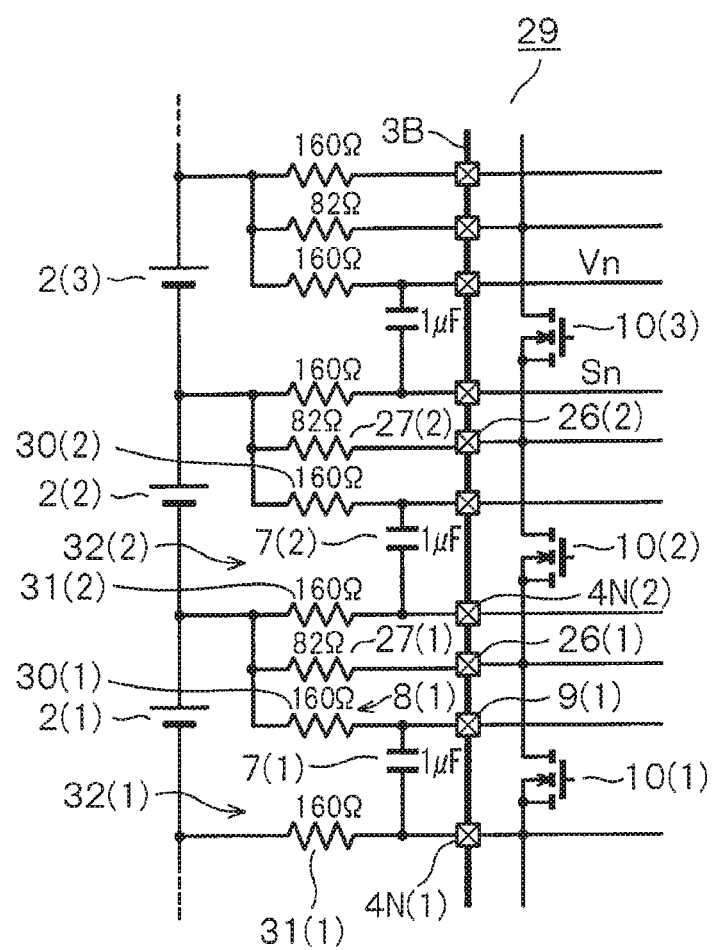
FIG. 14 is a circuit diagram illustrating a part of an assembled battery monitoring system according to a seventh embodiment of the present disclosure.

As shown in FIG. 14, an assembled battery monitoring system 29 of the seventh embodiment is provided by modifying the assembled battery monitoring system 25 of the fifth embodiment as follows:

the filtering resistance element 6 is replaced with a filtering resistance element 30;

the discharging resistance element 5N is replaced with a filtering resistance element 31;

the low-potential terminal of the capacitor 7 is coupled to the connection terminal 4N;

an RC filter 32 is provided by resistance elements 30 and 31 and a capacitor 7; and a source of the discharging switch 10 as a low-potential conduction terminal is coupled to the discharging terminal 26 of the battery cell 2 on a lower stage.

Each of the resistance elements 30 and 31 has a resistance value of 160Ω.

In this configuration, assumed that the discharging switch 10 is coupled between the filtering terminal 9 and the connection terminal 4N, that is, coupled to the capacitor 7 in parallel, without having the discharging terminal 26. In this case, when the discharging switch 10(2) is turned on, a discharging path of the battery cell 2(2) is formed as follows:

Positive terminal of battery cell 2(2)→resistance element 30(2)→filtering terminal 9(2)→discharging switch 10(2)→connection terminal 4N(2)→resistance element 31(2)→negative terminal of battery cell 2(2).

In this discharging path, the charges stored in the capacitor 7 are discharged, and thus this configuration corresponds to a structure of the conventional art.

In the assembled battery monitoring system 29 of the seventh embodiment, however, the configuration of the fifth embodiment is employed, and the discharging switch 10 is coupled between the discharging terminal 26 and the connection terminal 4N inside of the voltage monitoring IC 3B. As a result, when the discharging switch 10(2) is turned on, a discharging path of the battery cell 2(2) is formed as follows:

Positive terminal of battery cell 2(2)→discharging resistance element 27(2)→discharging terminal 26(2)→discharging switch 10(2)→discharging terminal 26(1)→discharging resistance element 27(1)→negative terminal of battery cell 2(2).

Therefore, the discharging path bypasses the RC filter 32(2), and thus the charges stored in the capacitor 7 are not discharged. Therefore, effects similar to the seventh embodiment will be achieved.

Eighth Embodiment

Figure 15:
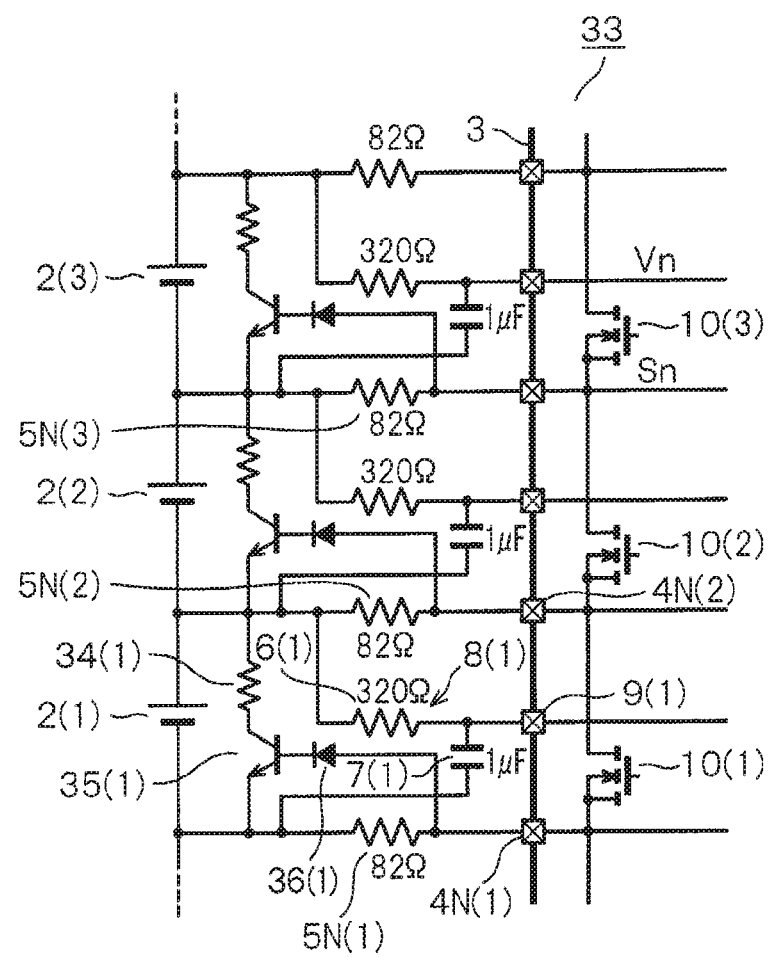
FIG. 15 is a circuit diagram illustrating a part of an assembled battery monitoring system according to an eighth embodiment of the present disclosure.

As shown in FIG. 15, an assembled battery monitoring system 33 of the eighth embodiment is provided by adding the following elements externally to the voltage monitoring IC 3 of the assembled battery monitoring system 15 of the first embodiment:

a series circuit including a discharging resistance element 34 and a discharging switch 35 made of an NPN transistor is coupled to the battery cell 2 in parallel; and a diode in a forward direction is coupled between the connection terminal 4N and a base of the discharging switch 35.

Next, an operation of the eighth embodiment will be described. When the discharging switch 10 provided inside of the voltage monitoring IC 3 is turned on, a current flows from the connection terminal 4N to the base of the discharging switch 35 through the diode 36, and thus the discharging switch 35 is turned on. As such, the discharging of the battery cell 2 can be conducted by the discharging resistance element 34, which is externally provided. Accordingly, the current having a larger value can be caused, and the time required for the equalization can be shortened.

Ninth to Fourteenth Embodiments

Assembled battery monitoring systems shown in FIGS. 16-21 are, respectively provided by employing the configuration of the eighth embodiment to the configurations of the second and seventh embodiments, and coupling positions of an anode of a diode 36 are different depending on the respective configurations.

Figure 16:
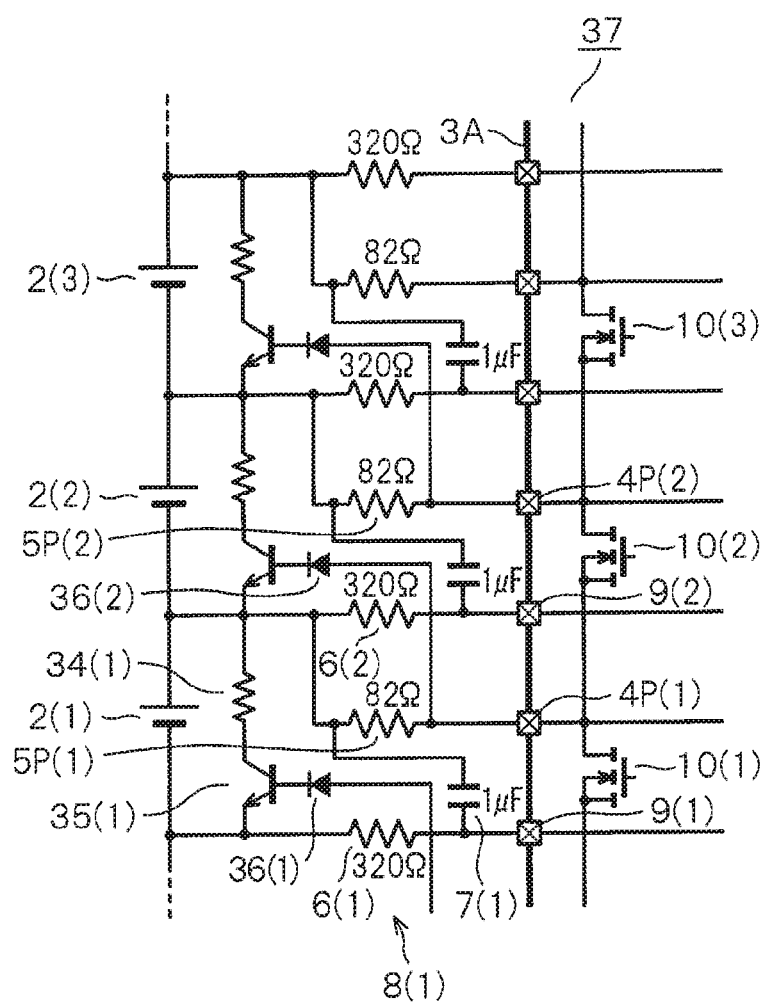
FIG. 16 is a circuit diagram illustrating a part of an assembled battery monitoring system according to a ninth embodiment of the present disclosure.

In an assembled battery monitoring system 37 of a ninth embodiment shown in FIG. 16, the anode of the diode 36(2) is coupled to the connection terminal 4P(1).

Figure 17:
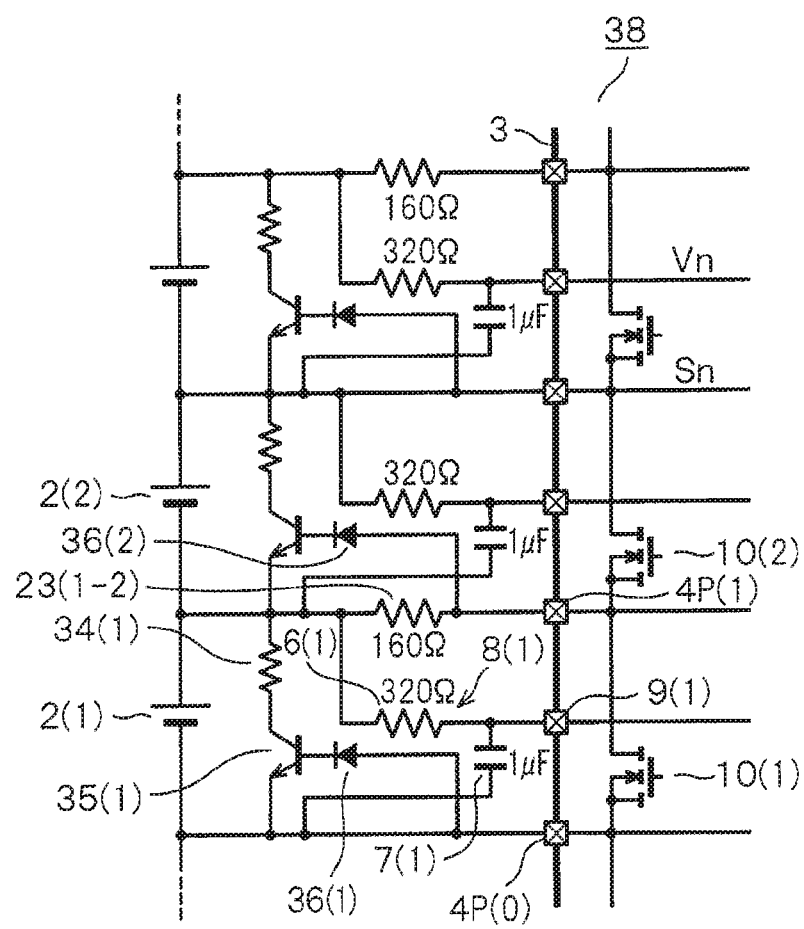
FIG. 17 is a circuit diagram illustrating a part of an assembled battery monitoring system according to a tenth embodiment of the present disclosure.

In an assembled battery monitoring system 38 of a tenth embodiment shown in FIG. 17, the anode of the diode 36(1) is coupled to the connection terminal 4P(1).

Figure 18:
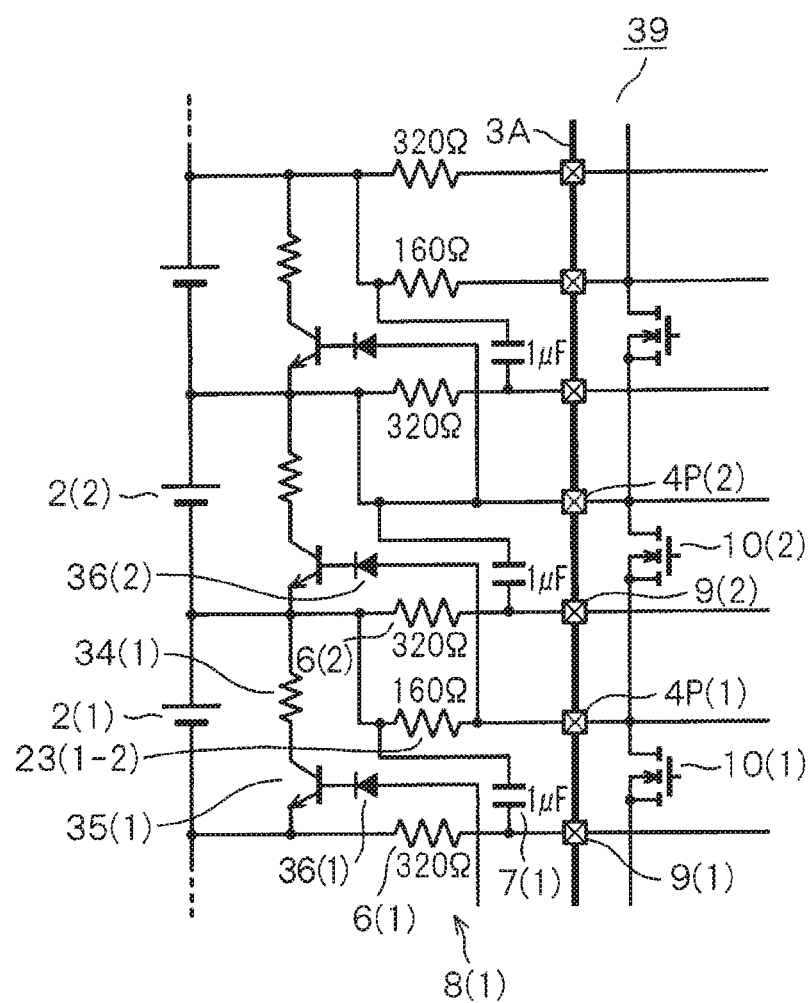
FIG. 18 is a circuit diagram illustrating a part of an assembled battery monitoring system according to an eleventh embodiment of the present disclosure.

In an assembled battery monitoring system 39 of an eleventh embodiment shown in FIG. 18, the anode of the diode 36(2) is coupled to the connection terminal 4P(1).

Figure 19:
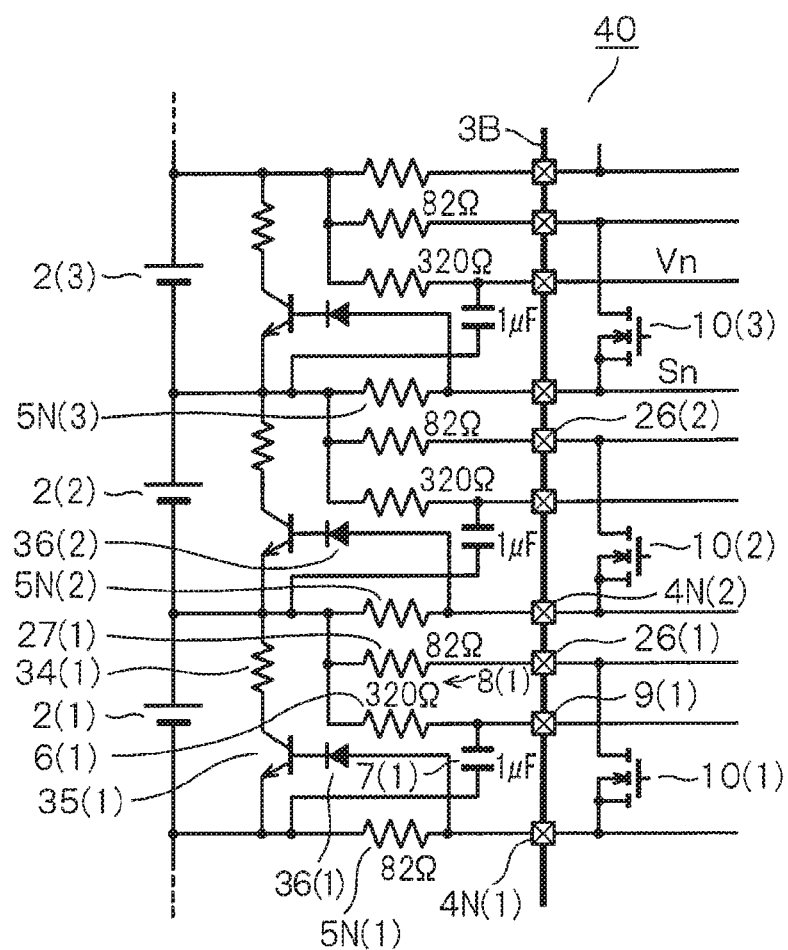
FIG. 19 is a circuit diagram illustrating a part of an assembled battery monitoring system according to a twelfth embodiment of the present disclosure.

In an assembled battery monitoring system 40 of a twelfth embodiment shown in FIG. 19, the anode of the diode 36( ) is coupled to the connection terminal 4N(1).

Figure 20:
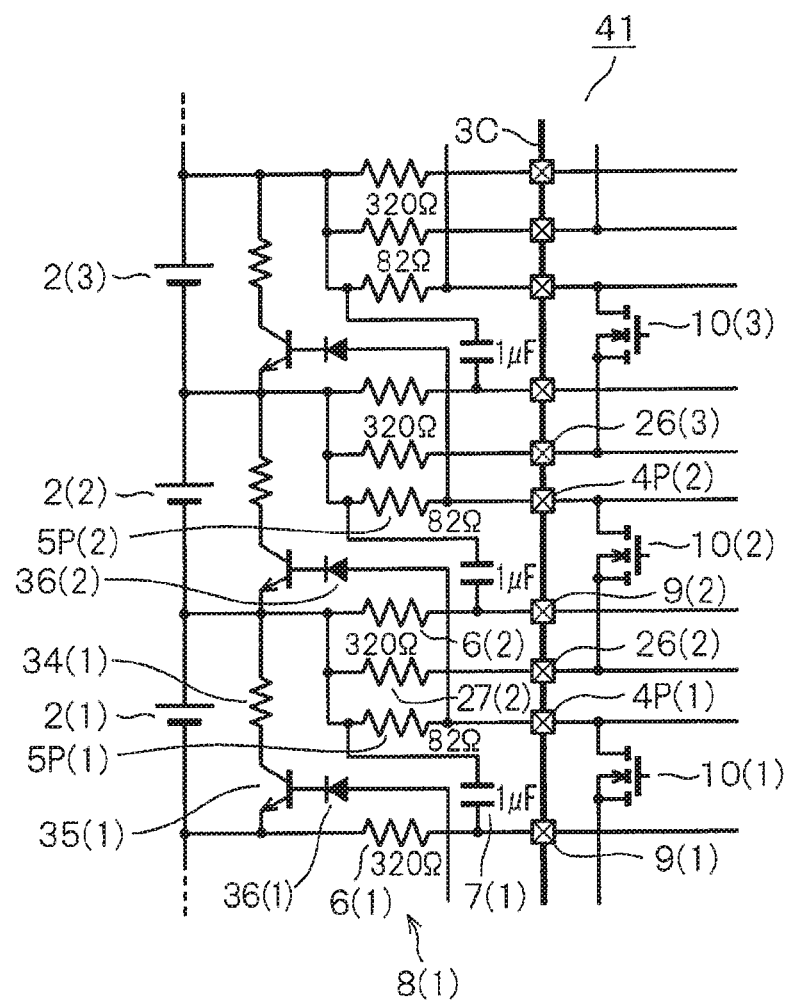
FIG. 20 is a circuit diagram illustrating a part of an assembled battery monitoring system according to a thirteenth embodiment of the present disclosure.

In an assembled battery monitoring system 41 of a thirteenth embodiment shown in FIG. 20, the anode of the diode 36(2) is coupled to the connection terminal 4P(1).

Figure 21:
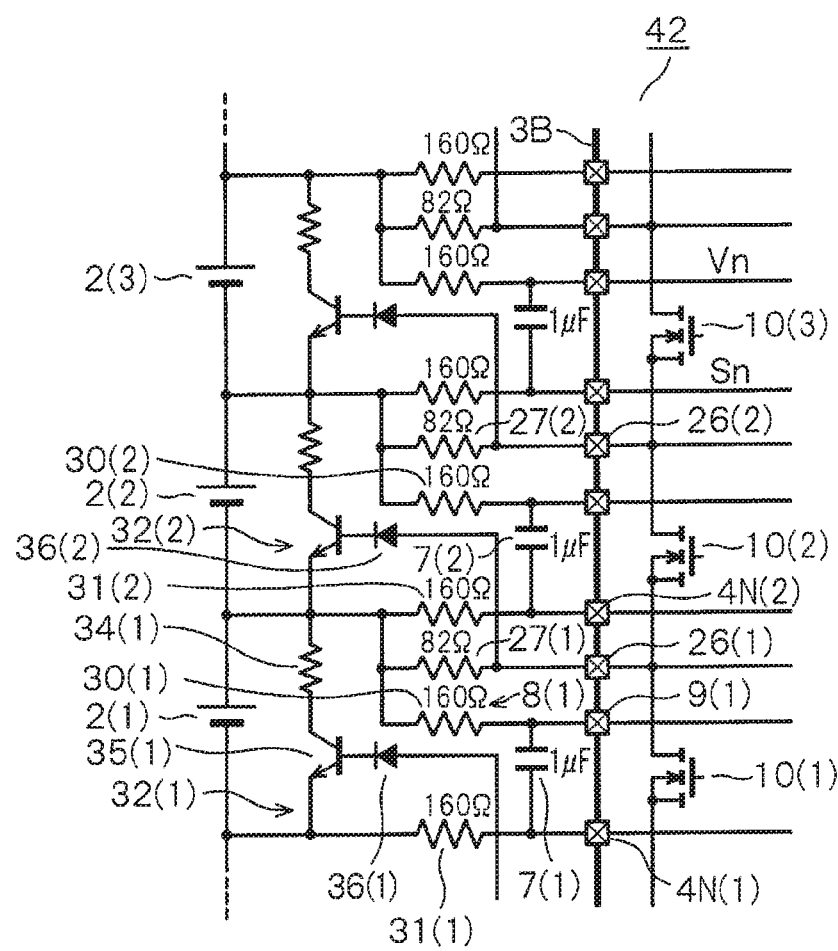
FIG. 21 is a circuit diagram illustrating a part of an assembled battery monitoring system according to a fourteenth embodiment of the present disclosure.

In an assembled battery monitoring system 42 of a fourteenth embodiment shown in FIG. 21, the anode of the diode 36(2) is coupled to the discharging terminal 26(1).

In the ninth to fourteenth embodiments having the configurations as described above, the effects similar to the eighth embodiment can be achieved.

The present disclosure is not limited to the embodiments described hereinabove and illustrated in the drawings, but may be modified or expanded as follows.

An inductor may be inserted between the positive terminal of each battery cell 2 and the corresponding RC filter 8 or the like. A Zener diode or a smoothing capacitor may be coupled in parallel to the battery cell 2.

The time constant of the RC filter and the resistance value of the discharging resistance element may be suitably changed depending on an individual design.

The element forming each switch may be any element such as FET, bipolar transistor and analog switch.

For example, as disclosed in JP 4548501 B2, the present disclosure may be applied to a case where an individual-type RC filter is employed to a structure in which disconnection of the assembled battery is detected using a current source.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An assembled battery monitoring system, comprising:
a voltage monitoring apparatus configured to monitor a voltage of each of a plurality of battery cells of an assembled battery, the plurality of battery cells being coupled in series and in a plurality of stages;
a plurality of discharging resistance elements and a plurality of RC filters that are correspondingly coupled between the plurality of battery cells and the voltage monitoring apparatus; and
a plurality of discharging switches disposed in the voltage monitoring apparatus and correspondingly to the plurality of the battery cells, and configured to discharge the corresponding battery cells, wherein
the voltage monitoring apparatus has at least three connection terminals for each of the plurality of battery cells, two of the at least three connection terminals are configured to be used to monitor a voltage of a corresponding battery cell through an output terminal of a corresponding RC filter, at least one of a remainder of the at least three connection terminals is configured to be used to form a discharging path of the corresponding battery cell when a corresponding discharging switch is turned on, each of the discharging resistance elements is disposed on the discharging path at a position that prohibits discharging of charges stored in a capacitor of the corresponding RC filter, and an end of the capacitor of the RC filter, which is different from an end providing the output terminal of the RC filter, is directly coupled to one of two terminals of a resistance element of an adjacent RC filter that is coupled to an adjacent battery cell, the one of the two terminals being adjacent to and being coupled to the adjacent battery cell and the other of the two terminals being opposite to the one terminal and adjacent to a capacitor of the adjacent RC filter.

2. The assembled battery monitoring system according to claim 1, wherein the RC filter has an input terminal coupled to a positive end of the corresponding battery cell, the capacitor of the RC filter has a low-potential terminal coupled to a negative end of the corresponding battery cell, and the discharging resistance element is coupled between at least one of the positive end and the negative end of the corresponding battery cell and a corresponding connection terminal of the voltage monitoring apparatus.

3. The assembled battery monitoring system according to claim 1, wherein the RC filter has an input terminal coupled to a negative end of the corresponding battery cell, the capacitor of the RC filter has a high-potential terminal coupled to a positive end of the corresponding battery cell, and the discharging resistance element is coupled between at least one of the positive end and the negative end of the corresponding battery cell and a corresponding connection terminal of the voltage monitoring apparatus.

4. The assembled battery monitoring system according to claim 2, wherein the discharging switch is coupled between corresponding terminals of the voltage monitoring apparatus.

5. The assembled battery monitoring system according to claim 1, wherein the end of the capacitor of the RC filter, which is different from the end providing the output terminal of the RC filter, that is directly coupled to the one of two terminals of the resistance element of the adjacent RC filter that is coupled to the adjacent battery cell is coupled only to three elements: the terminal of the resistance element of the adjacent battery cell, the adjacent battery itself, and one of the plurality of discharging resistance elements.

6. The assembled battery monitoring system according to claim 1, wherein the plurality of battery cells of the assembled battery is external to the voltage monitoring apparatus.

7. The assembled battery monitoring system according to claim 6, wherein the end of the capacitor of the RC filter, which is different from the end providing the output terminal of the RC filter, that is directly coupled to the one of the two terminals of the resistance element of the adjacent RC filter that is coupled to the adjacent battery cell, is coupled only to three elements: the terminal of the resistance element of the adjacent battery cell, the adjacent battery itself, and one of the plurality of discharging resistance elements.

8. An assembled battery monitoring system, comprising:

a voltage monitoring apparatus configured to monitor a voltage of each of a plurality of battery cells of an assembled battery, the plurality of battery cells being coupled in series and in a plurality of stages;

a plurality of discharging resistance elements and a plurality of RC filters that are correspondingly coupled between the plurality of battery cells and the voltage monitoring apparatus; and a plurality of discharging switches disposed in the voltage monitoring apparatus and correspondingly to the plurality of the battery cells, and configured to discharge the corresponding battery cells, wherein the voltage monitoring apparatus has at least three connection terminals for each of the plurality of battery cells, two of the at least three connection terminals are configured to be used to monitor a voltage of a corresponding battery cell through an output terminal of a corresponding RC filter, at least one of a remainder of the at least three connection terminals is configured to be used to form a discharging path of the corresponding battery cell when a corresponding discharging switch is turned on, each of the discharging resistance elements is disposed on the discharging path at a position that prohibits discharging of charges stored in a capacitor of the corresponding RC filter, an end of the capacitor of the RC filter, which is different from an end providing the output terminal of the RC filter, is directly coupled to one of two terminals of a resistance element of an adjacent RC filter that is coupled to an adjacent battery cell, the one of the two terminals being adjacent to and being coupled to the adjacent battery cell and the other of the two terminals being opposite to the one terminal and adjacent to a capacitor of the adjacent RC filter, and the assembled battery monitoring system further comprises:

a plurality of external series circuits each including a discharging resistance element and a discharging switch, the plurality of external series circuits being correspondingly coupled in parallel to the battery cells, between the discharging resistance elements and the RC filters, wherein the discharging switch of each of the external series circuits is turned on when being conducted with a current flowing in the discharging path that is formed when the discharging switch is turned on.

9. The assembled battery monitoring system according to claim 8, wherein the RC filter has an input terminal coupled to a positive end of the corresponding battery cell, the capacitor of the RC filter has a low-potential terminal coupled to a negative end of the corresponding battery cell, and the discharging resistance element is coupled between at least one of the positive end and the negative end of the corresponding battery cell and a corresponding connection terminal of the voltage monitoring apparatus.

10. The assembled battery monitoring system according to claim 8, wherein the RC filter has an input terminal coupled to a negative end of the corresponding battery cell, the capacitor of the RC filter has a high-potential terminal coupled to a positive end of the corresponding battery cell, and the discharging resistance element is coupled between at least one of the positive end and the negative end of the corresponding battery cell and a corresponding connection terminal of the voltage monitoring apparatus.

11. The assembled battery monitoring system according to claim 9, wherein the discharging switch is coupled between corresponding terminals of the voltage monitoring apparatus.

12. The assembled battery monitoring system according to claim 9, wherein the capacitor of the RC filter has one end coupled to the positive end of the corresponding battery cell through a filtering resistance element and another end coupled to the negative end of the corresponding battery cell through a filtering resistance element, and at least one of both ends of the discharging switch is coupled to the positive end or the negative end of the corresponding battery cell through the discharging resistance element.

13. The assembled battery monitoring system according to claim 8, wherein the end of the capacitor of the RC filter, which is different from the end providing the output terminal of the RC filter, that is directly coupled to the one of the two terminals of the resistance element of the adjacent RC filter that is coupled to the adjacent battery cell, is coupled only to three elements: the terminal of the resistance element of the adjacent battery cell, the adjacent battery itself, and one of the plurality of discharging resistance elements.

14. The assembled battery monitoring system according to claim 8, wherein the plurality of battery cells of the assembled battery is external to the voltage monitoring apparatus.

15. The assembled battery monitoring system according to claim 14, wherein the end of the capacitor of the RC filter, which is different from the end providing the output terminal of the RC filter, that is directly coupled to the one of the two terminals of the resistance element of the adjacent RC filter that is coupled to the adjacent battery cell is coupled only to three elements: the terminal of the resistance element of the adjacent battery cell, the adjacent battery itself, and one of the plurality of discharging resistance elements.

\* \* \* \* \*